(12) United States Patent
Roth et al.

(10) Patent No.: US 6,532,565 B1
(45) Date of Patent: Mar. 11, 2003

(54) BURST ERROR AND ADDITIONAL RANDOM BIT ERROR CORRECTION IN A MEMORY

(75) Inventors: Ron M. Roth, Haifa (IL); Gadiel Seroussi, Cupertino, CA (US); Ian F. Blake, Toronto (CA)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/440,323

(22) Filed: Nov. 15, 1999

(51) Int. Cl.[7] ................. H03M 13/00; H03M 13/03
(52) U.S. Cl. ................. 714/761; 714/762; 714/787
(58) Field of Search ................. 714/761, 759, 714/785, 762, 763, 782, 752, 758, 52, 788, 787, 793

(56) References Cited

U.S. PATENT DOCUMENTS

| | | | | |
|---|---|---|---|---|
| 5,179,560 A | * | 1/1993 | Yamagishi et al. | 714/761 |
| 5,642,365 A | * | 6/1997 | Murakami et al. | 714/761 |
| 5,657,331 A | * | 8/1997 | Metzner et al. | 714/762 |
| 5,943,348 A | * | 8/1999 | Ly | 714/761 |

* cited by examiner

*Primary Examiner*—Christine T. Tu

(57) ABSTRACT

A system for memory word error correction that enables correction of burst errors in memory words. The system is based on an adaptation of two-error correction BCH code which yields burst error correction without increasing the number of error correction bits in the memory words over prior two-error BCH code error correction schemes. The adaptation of two-error correction BCH code when combined with additional techniques for detecting columns of burst errors enables the correction of burst errors and additional random bit errors in memory words.

18 Claims, 3 Drawing Sheets

BURST ERROR AND ADDITIONAL RANDOM BIT ERROR CORRECTION IN A MEMORY

BACKGROUND OF THE INVENTION

1. Field of Invention

The present invention pertains to the field of memories. More particularly, this invention relates to burst error and additional random bit error correction in a memory.

2. Art Background

A wide variety of memory systems commonly include mechanisms for performing error correction. Error correction mechanisms typically enable the detection and correction of some types of errors that occur in stored data. The error correction mechanisms used in prior memory systems are typically based on coding schemes in which a set of error correction bits are associated with each set of stored data bits. Each set of error correction bits is usually stored together with its associated data bits to form a memory word. The bit pattern of a set of error correction bits in a memory word is usually adapted to the data bits in the memory word in a manner that enables some degree of error detection and correction when the memory word is read out of memory.

For example, one type of coding scheme commonly used for error correction in memory systems is usually referred to as two-error correcting BCH code. Typically, error correction is performed by reading a memory word from memory and using the two-error correcting BCH code to calculate a value which is commonly referred to as a syndrome. The syndrome usually indicates whether an error is present in the memory word and enables correction of up to 2 random bit errors in the memory word.

One type of error that commonly occurs in memory systems may be referred to as a burst error. A typical burst error is an error that causes the corruption of several in a series of consecutive bits in a memory word. For example, a failed address line in a memory may cause burst errors that encompass 4 consecutive bits in memory words read from the memory. Unfortunately, prior error correction mechanisms that are based on two-error correction BCH codes usually cannot correct such burst errors. Such an inability to correct burst errors usually increases the down-time and maintenance costs of systems such as computer systems, server systems, mass storage systems, and communication systems.

SUMMARY OF THE INVENTION

A system for memory word error correction is disclosed that enables correction of burst errors in memory words. The system is based on an adaptation of two-error correction BCH code which yields burst error correction without increasing the number of error correction bits in the memory words over prior two-error BCH code error correction schemes. The adaptation of two-error correction BCH code when combined with additional techniques for detecting columns of burst errors enables the correction of burst errors and additional random bit errors in memory words.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
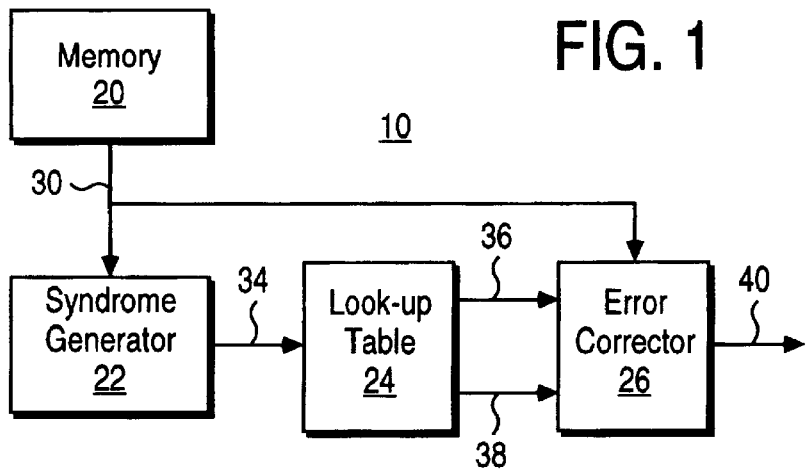
FIG. 1 shows a memory system that incorporates error correction for burst errors in memory words.

FIG. 1 shows a memory system 10 which incorporates error correction for burst errors in memory words. The memory system 10 includes a memory 20 that stores a set of memory words. In one embodiment, each memory word stored in the memory 20 includes 128 data bits and 16 error correction bits. The error correction bits of each particular memory word are generated using an adaptation of two-error error correcting BCH code. The two-error correcting BCH code may be represented as a matrix H in the following manner.

$$H = \begin{vmatrix} 1 & \alpha & \alpha^2 & \alpha^3 & \cdots & \alpha^{254} \\ 1 & \alpha^3 & \alpha^6 & \alpha^9 & \cdots & \alpha^{762} \end{vmatrix}$$

H is a 16 bit by 255 bit matrix where each value defines an 8 bit column. The length of the matrix H may be shortened from 255 bits to a length which is appropriate to particular embodiments. For example, in an embodiment which uses 144 bit memory words, only the first 144 columns of H are used in a known manner.

In general, $\alpha$ is a primitive element of the field $K=GF(2^m)$ wherein GF refers to a Galois field. $\alpha$ generates the multiplicative group of K which is represented in the following manner.

$$K = GF(2^m) = 0 \cup (\alpha^0, \alpha^1, \alpha^2, \ldots \alpha^{2^m-2})$$

where m=8 in this example.

The two-error correcting BCH code is adapted to yield correction of burst errors along with 1 or 2 bit random errors by selecting the value of the primitive element $\alpha$ so that 1 and 2 bit random errors in a memory word generate different syndromes than burst errors of B consecutive bits in the memory word. Such a separation of syndromes enables correction of a 1 or 2 bit random error or a B bit burst error in the same memory word read from the memory 20. This separation of syndromes that yields burst error correction is accomplished by selecting the value of the primitive element $\alpha$ such that the following four values are all distinct and all have trace 1.

$$\frac{1+\alpha^3+\alpha^6}{(1+\alpha+\alpha^2)^3}, \frac{1+\alpha^3+\alpha^9}{(1+\alpha+\alpha^3)^3}, \frac{1+\alpha^3+\alpha^9}{(1+\alpha^2+\alpha^3)^3}, \frac{1+\alpha^3+\alpha^6+\alpha^9}{(1+\alpha+\alpha^2+\alpha^3)^3}$$

This requirement is met when a is a root of the following polynomial.

$$M_1(x) = x^8+x^6+x^4+x^3+x^2+x+1$$

in an embodiment in which m=8 and the length B of a burst error equals 4.

When a memory word is read out of the memory 20 its data bits and error correction bits are provided to a syndrome generator 22 and an error corrector 26 via a data path 30. The syndrome generator 22 generates a syndrome on a syndrome path 34 in response to the memory word on the data path 30. The syndrome generator 22 generates a syndrome according to the following matrix equation.

$$S=HR^T$$

where S is the syndrome vector and R is the memory word vector on the data path 30.

The memory system 10 includes a look-up table 24 that stores a set of information for each of the possible values of the syndrome vector S on the syndrome path 34. The information in each entry of the look-up table 24 includes an error indication along with an error pattern for any of the correctable bits that are in error. An error indication may specify no error, i.e. the syndrome equals 0, or a correctable error such as a 1 bit random error at a particular bit location or 2 random bit errors at particular bit locations or a burst error starting at a particular bit location, or may indicate an uncorrectable error pattern. The error pattern in one embodiment is a 144 bit error pattern.

The syndrome vector S carried on the syndrome path 34 provides an address input to the look-up table 24. In one embodiment, the syndrome is a 16 bit value and the look-up table 24 has 64K entries. The error indication and the error pattern are read out of the addressed entry of the look-up table 24 via a path 36 and a path 38, respectively, in response to the syndrome carried on the syndrome path 34. The error corrector 26 applies appropriate corrections, if any, to the memory word carried on the data path 30 in response to the error indication and error pattern on the paths 36 and 38, thereby yielding a corrected memory word on an output path 40 of the memory system 10.

If the error indication on the path 36 specifies that there is no error, then the error corrector 26 provides the output path 40 with the memory word carried on the data path 30 without modification. If the error indication on the path 36 specifies that there is a correctable error, then the error corrector 26 applies a correction to the memory word carried on the data path 30.

For multiple bit errors, the error corrector 26 applies a correction by performing an exclusive-OR of the memory word carried on the data path 30 with the error pattern on the path 38. For single bit errors, the error corrector 26 applies a correction by performing an exclusive-OR of the memory word carried on the data path 30 with an error pattern which is implied by the location of the single bit error. Alternatively, the look-up table 24 may store error patterns for single bit errors in which case the error corrector 26 applies a correction for single bit random errors by performing an exclusive-OR of the memory word carried on the data path 30 with the error pattern on the path 38.

Figure 2:
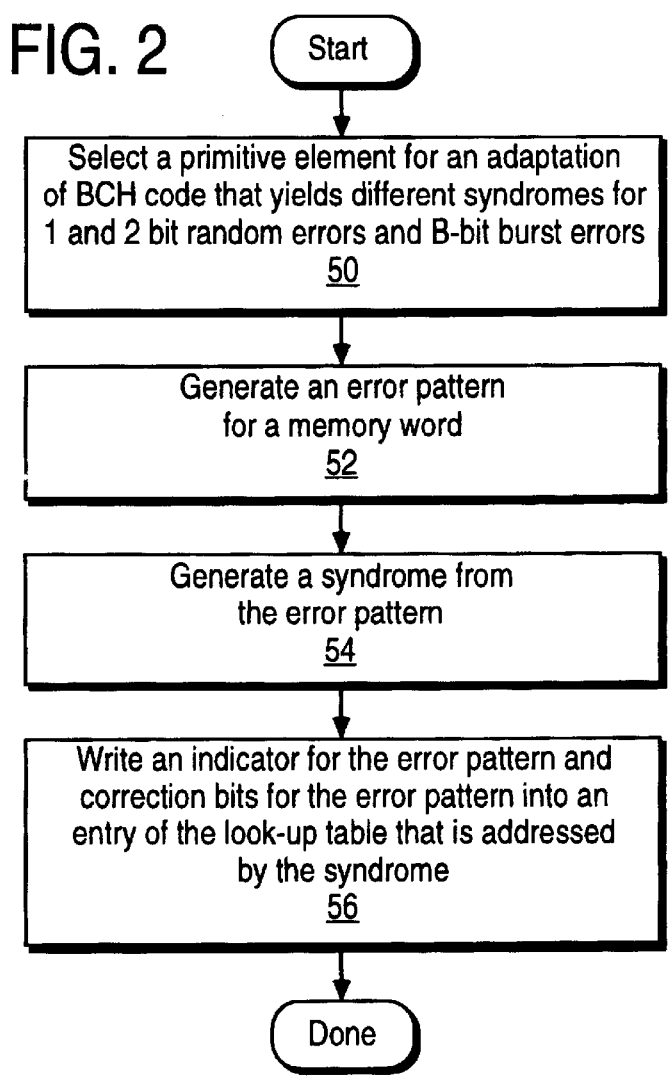
FIG. 2 shows a method for generating the information stored in the entries of a look-up table that enables correction of burst errors.

FIG. 2 shows a method for generating the information stored in the entries of the look-up table 24. At step 50, a primitive element α is selected for an adaptation of two-error correcting BCH code that yields different syndromes for 1 and 2 bit random errors and B-bit burst errors in accordance with the requirements for α that are set forth above. This careful selection of α ensures that syndromes for 1 and 2 bit random errors will not overlap syndromes for burst errors. Steps 52–56 are then performed systematically to generate syndromes and corresponding error indications and error patterns for all possible 1 and 2 random bit error patterns and 4 bit burst error patterns in a memory word. Thereafter, the entry of the look-up table 24 which is addressed by a syndrome equal to zero is marked with the error indication "no error" and the other unmarked entries of the look-up table 24 are marked "uncorrectable."

At step 52, an error pattern is generated for a memory word. The error pattern may be a 1 bit random error located anywhere in a 144 bit memory word, a pattern of 2 random bit errors located anywhere in a 144 bit memory word, or in an embodiment where B=4 a 4 bit burst error starting at bit location 0, or 1, or 2, etc up to bit location 140. The are 15 patterns of possible nonzero bursts. In a systematic pattern generation procedure, this number may be reduced to 8 by assuming that the first bit of the burst is a "1."

At step 54, a syndrome is generated from the error pattern generated at step 52. The syndrome may be generated in a manner similar to that used by the syndrome generator 22. That is by performing the following matrix calculation.

$$S=HE^T$$

where E is a vector which represents the error pattern generated at step 52 and H is a matrix based on the adaptation of two-error correcting BCH code as discussed above.

At step 56, an error indication for the error pattern generated at step 52 and the error pattern are written into an entry of the look-up table 24 that is addressed by the syndrome generated at step 54. The error indication and the error pattern provide the information that will be read out via paths 36 and 38 in response to a syndrome vector on the syndrome path 34.

For example, assume that the error pattern generated at step 52 is a burst error starting at bit location 8 of a memory word and consisting of 4 consecutive bits in error. This corresponds to an error vector E of 00000001111000000 . . . 0, i.e. all bits of E except bits 8–11 are zero. At step 54, a syndrome $S_{B8}$ is generated using the following matrix calculation.

$$S_{B8}=HE_{B8}^T$$

where $E_{B8}$ is the vector 00000001111000000 . . . 0. $S_{B8}$ is a 16 bit vector ranging from 0 through $2^{16}-1$ which is the number of entries in the look-up table 24. At step 56, an error indication that specifies a burst error starting at bit location 8 is written into the entry of the look-up table 24 that is addressed by the $S_{B8}$ and the error pattern for bits 8–11 is written into that entry.

In another example, assume that the error pattern generated at step 52 is a 1 bit error starting at bit location 40 of a memory word. This corresponds to an error vector E having all bits except bit 40 equal to zero. At step 54, a syndrome $S_{40}$ is generated using the following matrix calculation.

$$S_{40}=HE_{40}^T$$

where $E_{40}$ is a vector having all but bit 40 set to zero. $S_{40}$ is a 16 bit vector ranging from 0 through $2^{16}-1$. At step 56, an error indication that specifies a single bit error starting at bit location 40 is written into the entry of the look-up table 24 that is addressed by the $S_{40}$. The error pattern may be implied by this error indication or an error pattern with a "1" in bit position 40 and "0" in all the remaining bit position may be written to the look-up table 24 that is addressed by the $S_{40}$.

In yet another example, assume that the error pattern generated at step 52 includes 2 bit errors one at bit location 27 and another at bit location 140 of a memory word. This corresponds to an error vector E in which all bits except bits 27 and 140 are zero. At step 54, a syndrome $S_{27,140}$ is generated using the following matrix calculation.

$$S_{27,140}=HE_{27,140}^T$$

where $E_{27,140}$ is the vector in which all bits except bits 27 and 140 are zero. $S_{27,140}$ is a 16 bit vector ranging from 0 through $2^{16}-1$. At step 56, an error indication that specifies 2 bit errors at bit locations 27 and 140 is written into the entry of the look-up table 24 that is addressed by the $S_{27,140}$ and the error pattern for bits 27 and 140 is written into that entry. Alternatively, the error pattern may be implied from the bit locations of the 2 random bit errors an no error pattern need be stored in the look-up table 24.

Figure 3:
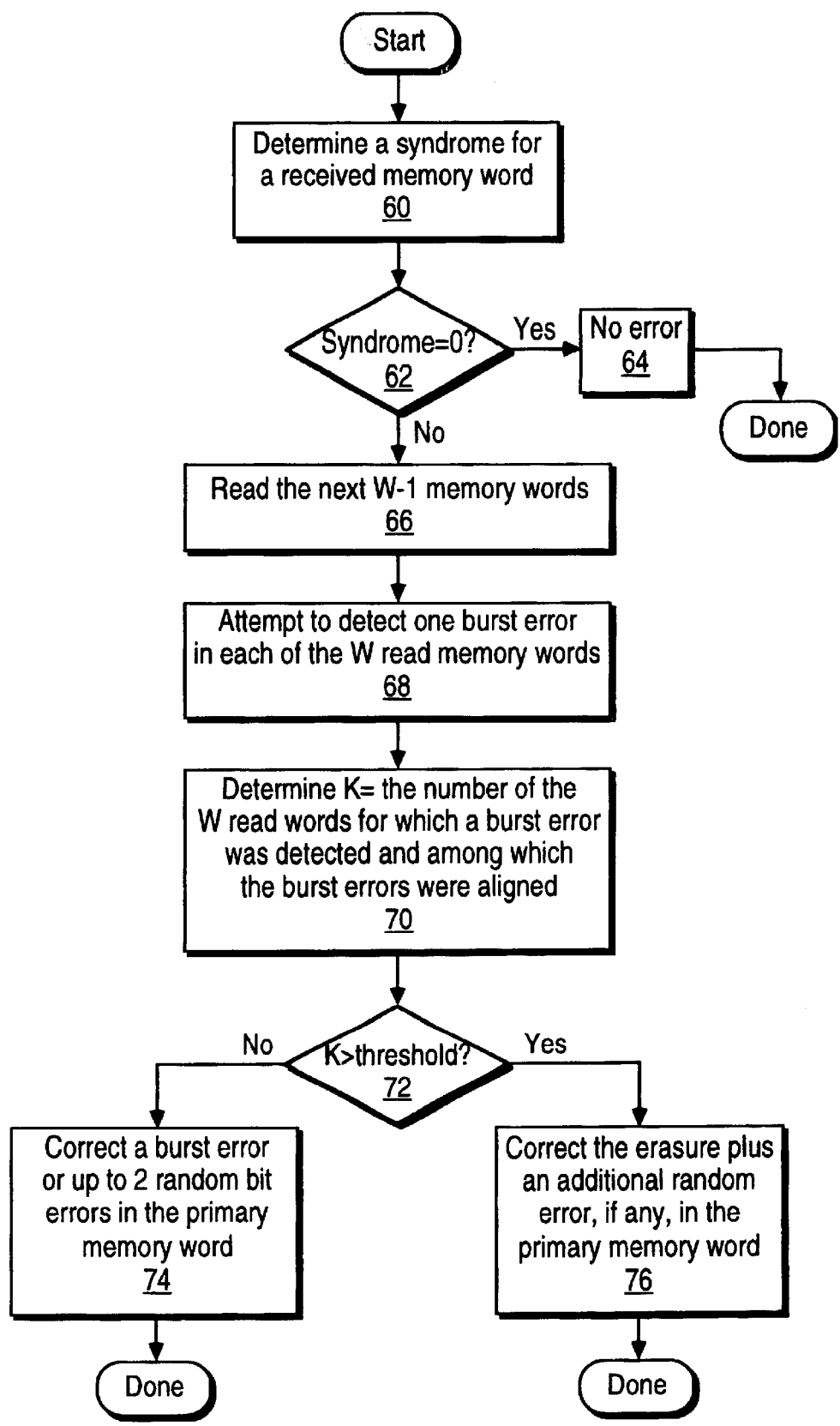
FIG. 3 shows a method for error correction that enables correction of a burst error plus an additional random bit error in the same memory word.

FIG. 3 shows a method for error correction that enables correction of a burst error plus an additional random bit error in the same memory word using the adaptation of two-error correcting BCH code that is set forth above.

At step 60, the syndrome for a memory word received from the memory 20 is determined. The memory word received at step 60 is referred to as the primary memory word for purposes of the following description. At step 62, if the syndrome for the primary memory word is equal to zero then it is assumed that there is no error (step 64) in the primary memory word.

Otherwise, at step 66 the next W–1 memory words are read from the memory 20 to obtain a group of W memory words. The block of W memory words include the primary word. The block of W memory words may be the primary word and the next W–1 words or the primary word and W–1 words obtained from the vicinity of the primary word.

At step 68, an attempt is made to detect a burst error in each of the W memory words that include the primary memory word and the next W–1 memory words. Burst errors may be detected in a manner previously described using the syndrome generator 22 and the look-up table 24. At step 70, a value K is determined. K is equal to the number of the W read words, the primary memory word and the next W–1 memory words, for which a burst error was detected at step 68 and among which the burst errors were aligned at the same bit location in the memory words. Multiple aligned burst errors in the W read memory words may indicate a bad column in the memory 20.

At step 72, if K is greater than a threshold number, then it may be speculated that an entire column of B bits of the memory 20 is yielding bad data. If so, then at step 76 the erasure, i.e. the burst error, in the primary memory word is corrected along with an additional random bit error, if any, in the primary memory word. Step 76 may be performed using the syndrome calculated for the primary memory word at step 60 along with additional information provided by the location of the erasure from step 70. The error pattern for correcting the burst error and the location for the additional random bit error may be provided by a look-up table.

Otherwise, at step 74 the burst error in the primary memory word or up to 2 random bit errors in the primary memory word are corrected in a manner similar to that previously described.

Figure 4:
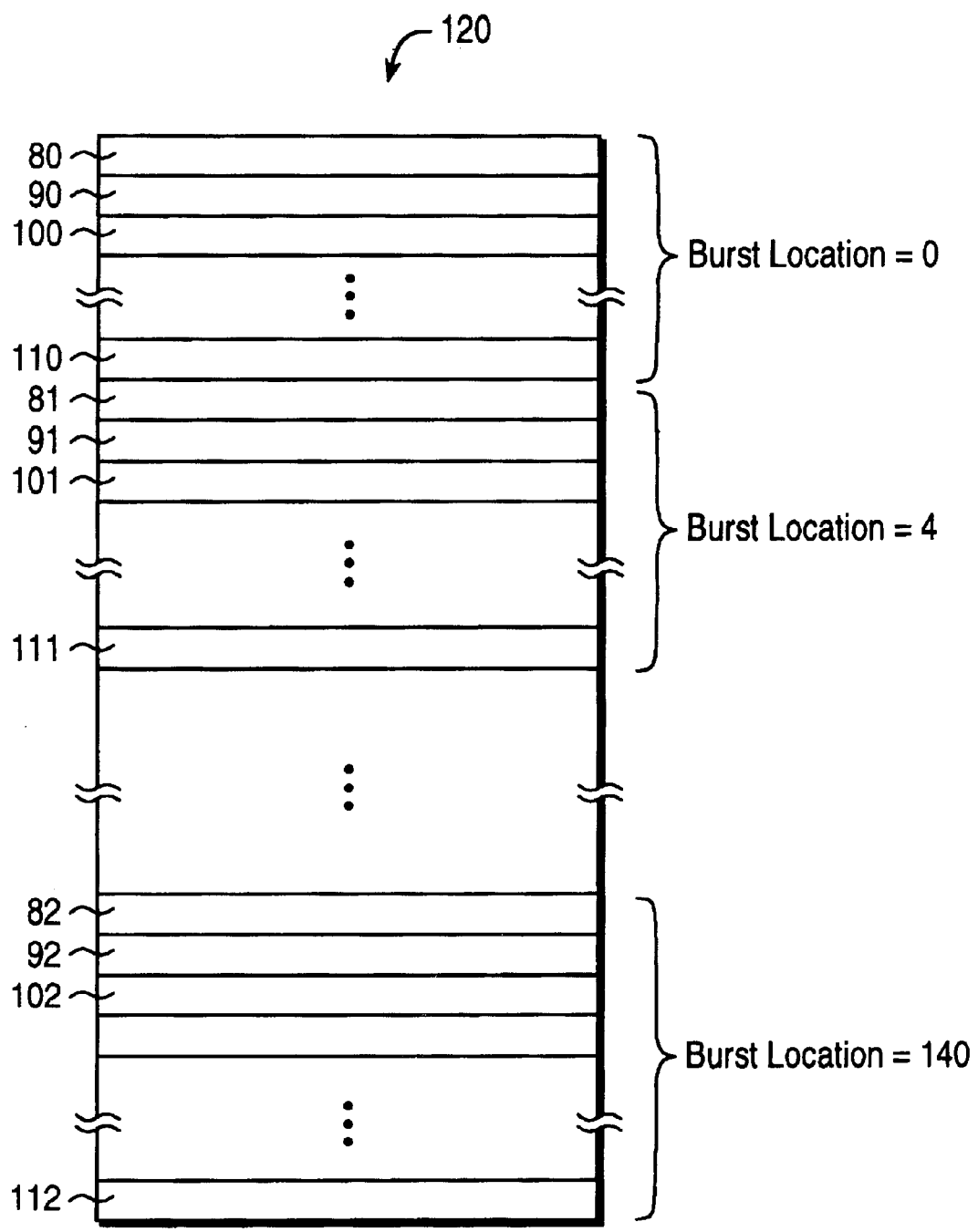
FIG. 4 shows one example of a look-up table for correcting a burst error and an additional random bit error in a memory word.

FIG. 4 shows one example of a look-up table 120 for correcting a burst error and an additional random bit error in a memory word in response to a syndrome for the memory word and the location of the burst error within the memory word. The look-up table 120 is divided into a set of sections each addressed by a location of a burst error. The burst errors of interest start at bit locations 0, 4, 8, ... 140. Each section includes entries for each of the possible $2^{16}$ syndrome values. For example, a set of entries 80–82 are addressed by a syndrome=0, a set of entries 90–92 are addressed by a syndrome=1, a set of entries 100–102 are addressed by a syndrome=2, and a set of entries 110–112 are addressed by a syndrome=$2^{16}-1$.

Each entry in the look-up table 120 includes an error pattern for the corresponding burst error and possibly the location of an additional random bit error. For example, the entries that correspond to burst location=4 each contain an error pattern for bits 4–7 and possibly information for correcting an additional random bit error in one of the bits 0–3 and 8–143.

The information for the entries of the look-up table 120 is determined by systematically generating error patterns and noting the corresponding syndrome values and burst locations. The information for the entries corresponding to a burst location=0 are determined by systematically generating error patterns in a memory word that includes burst error patterns in bit locations 0–3 and 0 or 1 random bit error patterns in locations 4–143. The information for the entries corresponding to a burst location=4 are determined by systematically generating error patterns in a memory word that include burst error patterns in bit locations 4–7 and random bit error patterns in locations 0–3, and 8–143, etc.

For example, an error pattern that includes a burst error in locations 0–3 and a bit error in location 109 is used to compute a syndrome $S_{B0,109}$ in a manner such as that described above and the entry in the burst location=0 section of the look-up table 120 that is addressed by $S_{B0,109}$ is written with the error pattern for the burst error in locations 0–3 and the location 109 of the bit error. The information for the remaining combinations of random bit errors and burst error patterns for location 0–3 may be generated in α similar manner. The guidelines for the choice of α ensure that these patterns will yield different syndromes.

The look-up table 120 includes $2^{16}$ entries for each of the 140 burst locations. The look-up table 120 may be shortened to $2^{16}$ entries by performing a cyclic shift modulo 255 on a 255 bit code word which includes the 144 bit memory word being processed with the remaining bits of the code word padded with zeros. The shift is performed using the location of the erasure which is provided from step 70 above. If i is the location of the erasure, then the code word is shifted by i bits to the left. A syndrome is then computed for the shifted code word to provide an address to the shortened version of the look-up table 120 which now includes only the section corresponding to a burst in location=0. The error pattern, if any, obtained from the shortened version of the look-up table 120 is then shifted to the right by i bits to be used in correcting the memory word being processed.

The following is a method for correcting a burst error or 1 or 2 random bit errors in a memory word that uses a shortened look-up table in comparison to the look-up table 24. In step one, a syndrome vector $(S_0 S_1)^T$ for the memory word is computed using the following (equation 1)

$$\begin{vmatrix} S_0 \\ S_1 \end{vmatrix} = \sum_{j=0}^{n-1} y_j \begin{vmatrix} \alpha^j \\ \alpha^{3j} \end{vmatrix} = \begin{vmatrix} y(\alpha) \\ y(\alpha^3) \end{vmatrix}$$

over $GF(2^m)$. If the syndrom vector is equal to zero then it is assumed there is no error and the method ends.

In step two, $S_1/(S_0)^3$ is computed and a polynomial $$a(x) \in F_B[x]$$

with a(0)=1 is found, if any, that satisfies $$\frac{S_1}{S_0^3} = \frac{a(\alpha^3)}{(a(\alpha))^3}$$

where $F_B[x]$ denotes the set of all polynomials of degree at most B–1 with binary coefficients. If such a polynomial exists then the starting location i of the burst is found by computing $\alpha^i = S_0/a(\alpha)$.

In step three, if there is no such polynomial, the two random bit errors can be corrected using standard BCH decoding methods.

Both steps two and three may be implemented using a look-up table of size $2^m(m-1)$ bits which is indexed by the value $S_1/(S_0)^3$ which is only 8 bits in comparison to the look-up table 24 which is indexed by the 16 by syndrome vector S. When $S_1/(S_0)^3=1$ or $Tr(S_1/(S_0)^3+1)=1$, the entry in the look-up table contains the B–1 non-constant coefficients of the unique polynomial a(x), if any, that yields a burst error pattern that satisfies equation 1. Otherwise, $Tr(S_1/(S_0)^3+1)=0$, in which case the entry in the look-up table contains the roots of the following normalized polynomial.

$$z^2 + z + 1 + \frac{S_1}{S_0^3}$$

When those roots are represented as polynomials in $F_m[\alpha]$ then they are identical in all but their constant coefficient. The case $S_1/(S_0)^3=1$ which corresponds to one random bit error and is handled in step two may be shifted to step three.

The following is a method for correcting a burst error and a possible additional random bit error in a memory word when the location of the burst error is known that uses a further shortened look-up table in comparison to the shortened version of the look-up table 120 discussed above. First, a syndrome vector for the memory word is computed using equation 1.

The syndrome vector is transformed by defining $$\hat{S}_0 = \frac{S_0}{\alpha^i}$$
$$\hat{S}_1 = \frac{S_1}{\alpha^{3i}}$$

where i is the known location of the burst error. This is analogous to the shift left by i procedure discussed above. In addition, $$\gamma = \alpha^{r-i}$$

where r is the unknown location of the additional random error, or $\gamma=0$ if there is no such error.

Then we have the following (equations 2 and 3).

$$\hat{S}_0 = a(\alpha) + \gamma$$
$$\hat{S}_1 = a(\alpha^3) + \gamma^3$$

where $\gamma$ takes any value of $GF(2^m)$ other than the elements in the following set.

$$D_B(\alpha) = [\alpha^j]_{j=0}^{B-1}$$

L: $GF(2^m) \to GF(2^m)$ is a linear function over F; that is $L(\beta+\gamma) = L(\beta) + L(\gamma)$ for every $\beta, \gamma \in GF(2^m)$. L satisfies $L(\alpha^j) = \alpha^{3j}$ for $0 \le j < B$. Since $B \le m$, such a linear function always exists. Applying the function L to both sides of equation 2 and adding the results to respective sides of equation 3 yields the following (equation 4).

$$L(\hat{S}_0) + \hat{S}_1 = L(\gamma) + \gamma^3$$

The value on the left-hand side of equation 4 may be computed by the error corrector 26. That value may be used to compute y from equation 4. The function L is selected so that for each value $\omega \in GF(2^m)$, the number of solutions of $L(\gamma) + \gamma^3 = \omega$ for $\gamma \in GF(2^m) \setminus D_B(\alpha)$ is relatively small. An example is the function $L: F^8 \to F^8$ defined by L:$x \to Ax$ where $$A = \begin{vmatrix} 1 & 0 & 0 & 0 & 0 & 1 & 0 & 0 \\ 0 & 0 & 0 & 1 & 0 & 0 & 0 & 0 \\ 0 & 0 & 0 & 1 & 1 & 1 & 1 & 1 \\ 0 & 1 & 0 & 1 & 1 & 1 & 0 & 1 \\ 0 & 0 & 0 & 1 & 0 & 1 & 0 & 0 \\ 0 & 0 & 0 & 1 & 0 & 1 & 1 & 0 \\ 0 & 0 & 1 & 0 & 1 & 1 & 1 & 1 \\ 0 & 0 & 0 & 1 & 1 & 1 & 0 & 0 \end{vmatrix}$$

It should be noted that $L(\gamma) = \gamma^3$ for every $\gamma \in D_4(\alpha)$ and for $\gamma = 0$. Using this mapping, a look-up table may be constructed that provides for every element $\omega \in GF(2^8)$ the solutions of $L(\gamma) + \gamma^3 = \omega$ with $\gamma \in GF(2^m) \setminus D_B(\alpha)$. For the example function L above, the size of the look-up table is $2^8 \times (3 \times 8)$ bits. The error corrector 26 selects the solution $\gamma$ for which $$\hat{S}_0 + \gamma \epsilon F_B[\alpha]$$

and the erasure value is then obtained by $$a(\alpha) = \hat{S}_0 + \gamma.$$

The methods and apparatus disclosed herein including the functionality of the syndrome generator 22 and the error corrector 26 may be implemented using a variety of combinations of hardware and/or software/firmware. For example, a processor or dedicated hardware arrangement may be used to carry out the methods steps and perform the calculations described herein.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. An apparatus for detecting and correcting errors in a memory word, comprising:
    means for determining a syndrome in response to the memory word using a code which is adapted to yield a set of values of the syndrome for a set of 1 and a set of 2 bit random errors in the memory word which are separate from a set of values of the syndrome for a set of burst errors in the memory word;
    means for correcting the 1 and 2 bit random errors and the burst errors in response to the syndrome.

2. The apparatus of claim 1, wherein the code is a two-error correcting BCH code which is based on a primitive element having a value which is preselected to yield the different values of the syndrome.

3. The apparatus of claim 1, wherein the means for correcting comprises a look-up table having a set of entries each of which is addressed by a corresponding value of the syndrome, each entry storing a set of information that specifies one of the 1 or 2 bit random errors or one of the burst errors and that enables correction of the corresponding error.

4. The apparatus of claim 1, further comprising:
    means for detecting a bit location for a column of burst errors in the memory word and a set of additional memory words;
    means for correcting the burst errors in the memory word and correcting an additional random bit error in the memory word in response to the bit location for the column and the syndrome for the memory word.

5. The apparatus of claim 4, wherein the means for detecting includes means for determining whether more than a threshold number of the memory word and the additional memory words have a burst error at the bit location.

6. An apparatus for detecting and correcting errors in a memory word, comprising:

means for determining a syndrome in response to the memory word using a code which is adapted to yield different values of the syndrome for a set of 1 and a set of 2 bit random errors in the memory word and a set of burst errors in the memory word;

means for correcting the 1 and 2 bit random errors and the burst errors in response to the syndrome wherein the means for correcting comprises means for determining a look-up table index having fewer bits than a number of bits in the syndrome;

look-up table having a set of entries which are addressed by the look-up table index, each entry storing a set of information that specifies one of the 1 or 2 bit random errors or one of the burst errors and that enables correction of the corresponding error.

7. An apparatus for detecting and correcting errors in a memory word, comprising:

means for determining a syndrome in response to the memory word using a code which is adapted to yield different values of the syndrome for a set of 1 and a set of 2 bit random errors in the memory word and a set of burst errors in the memory word;

means for correcting the 1 and 2 bit random errors and the burst errors in response to the syndrome;

means for detecting a bit location for a column of burst errors in the memory word and a set of additional memory words;

means for correcting the burst errors in the memory word and correcting an additional random bit error in the memory word in response to the bit location for the column and the syndrome for the memory word wherein the means for correcting the burst errors in the memory word and correcting the additional random bit error in the memory word comprises a look-up table having a set of entries each of which is addressed by a corresponding value of the bit location and a corresponding value of the syndrome, each entry storing a set of information that specifies the corresponding additional random bit error and that enables correction of the corresponding additional random bit error and the corresponding burst error.

8. An apparatus for detecting and correcting errors in a memory word, comprising:

means for determining a syndrome in response to the memory word using a code which is adapted to yield different values of the syndrome for a set of 1 and a set of 2 bit random errors in the memory word and a set of burst errors in the memory word;

means for correcting the 1 and 2 bit random errors and the burst errors in response to the syndrome;

means for detecting a bit location for a column of burst errors in the memory word and a set of additional memory words;

means for correcting the burst errors in the memory word and correcting an additional random bit error in the memory word in response to the bit location for the column and the syndrome for the memory word wherein the means for correcting the burst errors in the memory word and correcting the additional random bit error in the memory word comprises means for cyclically shifting the memory word in response to the bit location for the column;

look-up table having a set of entries each of which is addressed by a corresponding value of the syndrome, each entry storing a set of information that specifies the corresponding additional random bit error and that enables correction of the corresponding additional random bit error and the corresponding burst error.

9. An apparatus for detecting and correcting errors in a memory word, comprising:

means for determining a syndrome in response to the memory word using a code which is adapted to yield different values of the syndrome for a set of 1 and a set of 2 bit random errors in the memory word and a set of burst errors in the memory word;

means for correcting the 1 and 2 bit random errors and the burst errors in response to the syndrome;

means for detecting a bit location for a column of burst errors in the memory word and a set of additional memory words;

means for correcting the burst errors in the memory word and correcting an additional random bit error in the memory word in response to the bit location for the column and the syndrome for the memory word wherein the means for correcting the burst errors in the memory word and correcting the additional random bit error in the memory word comprises means for determining a look-up table index by transforming the syndrome based on a linear mapping;

look-up table having a set of entries which are addressed by the look-up table index, each entry storing a set of information that specifies the corresponding additional random bit error and that enables correction of the corresponding additional random bit error and the corresponding burst error.

10. A method for detecting and correcting errors in a memory word, comprising the steps of:

adapting a code for generating a syndrome to yield different values of the syndrome for a set of 1 and a set of 2 bit random errors in the memory word from a set of burst errors in the memory word;

determining a syndrome in response to the memory word using the code;

correcting the 1 and 2 bit random errors and the burst errors in response to the syndrome.

11. The method of claim 10, wherein the code is a two-error correcting BCH code which is based on a primitive element having a value and wherein the step of adapting includes the step of selecting the value to yield the different values of the syndrome.

12. The method of claim 10, wherein the step of correcting comprises the step of reading a look-up table having a set of entries each of which is addressed by a corresponding value of the syndrome, each entry storing a set of information that specifies one of the 1 or 2 bit random errors or one of the burst errors and that enables correction of the corresponding error.

13. The method of claim 10, further comprising the steps of:

detecting a bit location for a column of burst errors in the memory word and a set of additional memory words;

correcting the burst errors in the memory word and correcting an additional random bit error in the memory word in response to the bit location for the column and the syndrome for the memory word.

14. The method of claim 13, wherein the step of detecting includes the step of determining whether more than a threshold number of the memory word and the additional memory words have a burst error at the bit location.

15. A method for detecting and correcting errors in a memory word, comprising the steps of:
   determining a syndrome in response to the memory word using a code which is adapted to yield different values of the syndrome for a set of 1 and a set of 2 bit random errors in the memory word and a set of burst errors in the memory word;
   correcting the 1 and 2 bit random errors and the burst errors in response to the syndrome wherein the step of correcting comprises the steps of
      determining a look-up table index having fewer bits than a number of bits in the syndrome;
      reading look-up table having a set of entries which are addressed by the look-up table index, each entry storing a set of information that specifies one of the 1 or 2 bit random errors or one of the burst errors and that enables correction of the corresponding error.

16. A method for detecting and correcting errors in a memory word, comprising the steps of:
   determining a syndrome in response to the memory word using a code which is adapted to yield different values of the syndrome for a set of 1 and a set of 2 bit random errors in the memory word and a set of burst errors in the memory word;
   correcting the 1 and 2 bit random errors and the burst errors in response to the syndrome;
   detecting a bit location for a column of burst errors in the memory word and a set of additional memory words;
   correcting the burst errors in the memory word and correcting an additional random bit error in the memory word in response to the bit location for the column and the syndrome for the memory word wherein the steps of correcting the burst errors in the memory word and correcting the additional random bit error in the memory word comprises the step of reading a look-up table having a set of entries each of which is addressed by a corresponding value of the bit location and a corresponding value of the syndrome, each entry storing a set of information that specifies the corresponding additional random bit error and that enables correction of the corresponding additional random bit error and the corresponding burst error.

17. A method for detecting and correcting errors in a memory word, comprising the steps of:
   determining a syndrome in response to the memory word using a code which is adapted to yield different values of the syndrome for a set of 1 and a set of 2 bit random errors in the memory word and a set of burst errors in the memory word;
   correcting the 1 and 2 bit random errors and the burst errors in response to the syndrome;
   detecting a bit location for a column of burst errors in the memory word and a set of additional memory words;
   correcting the burst errors in the memory word and correcting an additional random bit error in the memory word in response to the bit location for the column and the syndrome for the memory word wherein the steps of correcting the burst errors in the memory word and correcting the additional random bit error in the memory word comprise the steps of
      cyclically shifting the memory word in response to the bit location for the column;
      reading a look-up table having a set of entries each of which is addressed by a corresponding value of the syndrome, each entry storing a set of information that specifies the corresponding additional random bit error and that enables correction of the corresponding additional random bit error and the corresponding burst error.

18. A method for detecting and correcting errors in a memory word, comprising the steps of:
   determining a syndrome in response to the memory word using a code which is adapted to yield different values of the syndrome for a set of 1 and a set of 2 bit random errors in the memory word and a set of burst errors in the memory word;
   correcting the 1 and 2 bit random errors and the burst errors in response to the syndrome;
   detecting a bit location for a column of burst errors in the memory word and a set of additional memory words;
   correcting the burst errors in the memory word and correcting an additional random bit error in the memory word in response to the bit location for the column and the syndrome for the memory word wherein the steps of correcting the burst errors in the memory word and correcting the additional random bit error in the memory word comprise the steps of
      determining a look-up table index by transforming the syndrome based on a linear mapping;
      reading a look-up table having a set of entries which are addressed by the look-up table index, each entry storing a set of information that specifies the corresponding additional random bit error and that enables correction of the corresponding additional random bit error and the corresponding burst error.

* * * * *